United States Patent [19]

Kitamura et al.

[11] Patent Number: 4,868,090
[45] Date of Patent: Sep. 19, 1989

[54] METHODS FOR THE MANUFACTURE OF CYLINDRICAL PHOTOSENSITIVE RESIN STRUCTURES AND CYLINDRICAL PRINTING PLATES

[75] Inventors: Atsushi Kitamura, 30, Izumi-Hommachi 5-chome, Kanazawa-shi, Ishikawa 921; Mayumi Yoshimoto, Shizuoka, both of Japan

[73] Assignee: Atsushi Kitamura, Kanazawa, Japan

[21] Appl. No.: 51,093

[22] PCT Filed: Aug. 23, 1986

[86] PCT No.: PCT/JP86/00435
§ 371 Date: Apr. 22, 1987
§ 102(e) Date: Apr. 22, 1987

[87] PCT Pub. No.: WO87/01213
PCT Pub. Date: Feb. 26, 1987

[30] Foreign Application Priority Data

Aug. 24, 1985 [JP] Japan ............................ 60-186482
Sep. 30, 1985 [JP] Japan ............................ 60-218590

[51] Int. Cl.⁴ .............................................. G03F 7/24
[52] U.S. Cl. .................................. 430/271; 430/300; 430/306; 430/309; 430/935; 427/240; 101/463.1
[58] Field of Search ............... 430/271, 307, 309, 935, 430/273, 300, 306; 427/240, 241; 101/453, 463.1, 415.1

[56] References Cited

U.S. PATENT DOCUMENTS 3,294,889 12/1966 Downie et al. .................. 430/300 X
4,304,842 12/1981 Schoute .............................. 430/306

FOREIGN PATENT DOCUMENTS 49-116168 6/1974 Japan .
50-80366 6/1975 Japan .
54-121805 9/1979 Japan .

Primary Examiner—Jose G. Dees
Attorney, Agent, or Firm—Armstrong, Nikaido, Marmelstein, Kubovcik & Murray

[57] ABSTRACT

A liquid photosensitive composition is introduced into a hollow cylindrical element and the latter is spun at a high speed to centrifugally deposit the liquid photosensitive composition uniformly on the inner surface of the hollow cylindrical element and cause the resin composition to cure in situ. The above process provides a seamless cylindrical photosensitive resin structure. After the centrifugal formation of a photosensitive resin layer on the inner surface of the hollow cylindrical element, the photosensitive resin may be back-exposed from within the hollow cylindrical element and relief-exposed from outside of the hollow cylindrical element though an image carrier.

By the above method, resin plates and particularly those suited for flexographic printing can be manufactured, and using these resin plates, seamless image printing can be performed.

3 Claims, 4 Drawing Sheets

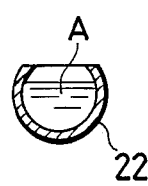
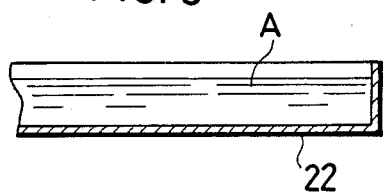
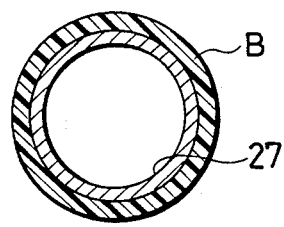
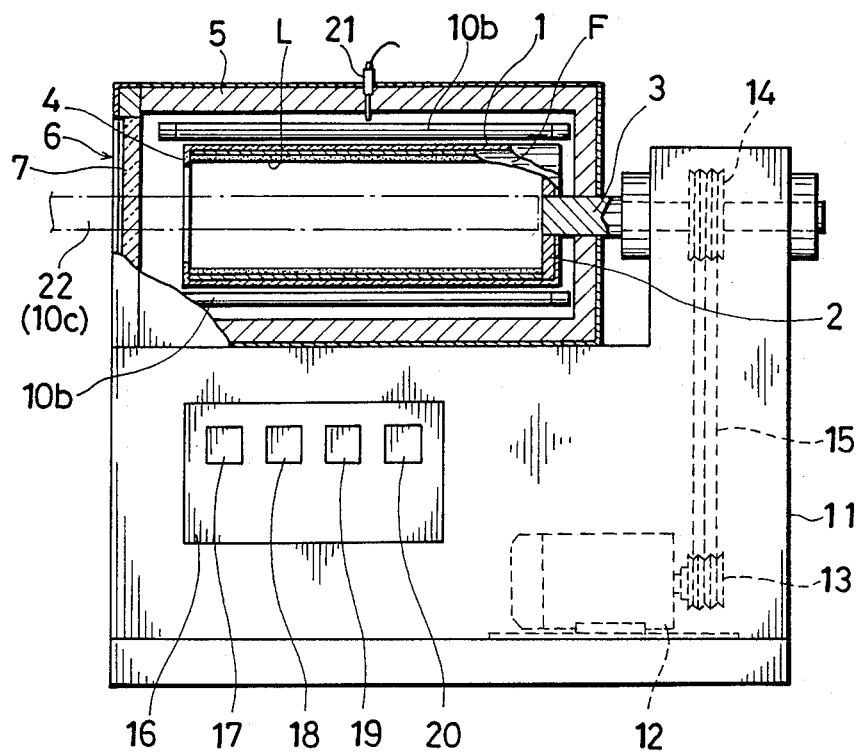

METHODS FOR THE MANUFACTURE OF CYLINDRICAL PHOTOSENSITIVE RESIN STRUCTURES AND CYLINDRICAL PRINTING PLATES

FIELD OF THE INVENTION

The present invention relates to a method for manufacturing a seamless cylindrical photosensitive resin structure and a seamless cylindrical printing plate for flexographic printing and other purposes.

BACKGROUND TECHNOLOGY

For the manufacture of relief printing plates, particularly seamless resin plates for flexographic printing, using a photosensitive resin, the following methods are known.

(i) The method comprising coating a cylindrical support element externally with a photosensitive resin and subjecting the resulting photosensitive resin layer to imagewise exposure to obtain a relief image. By way of illustration, a cured polymer sheet of predetermined thickness (for example, about 1.5 mm) is bonded to the surface of a steel cylinder with an adhesive, then a curable photosensitive resin is coated in a predetermined thickness (for example, about 1.0 mm) on top of said cured polymer sheet, and finally the coating layer is imagewise exposed to obtain a relief pattern.

(ii) The method which comprises wrapping a photosensitive resin sheet around a cylindrical supporting element, welding the joint under heat and pressure, and exposing the sheet imagewise to obtain a relief image. A typical procedure comprises wrapping an unexposed photosensitive resin sheet accurately on the circumferential surface of a cylinder, wrapping a heat-shrinkable film on top of said resin sheet, heating the assembly under reduced pressure to soften the sheet and integrate the seam evenly with the remainder of the sheet while calendering the same during heating to prepare a smooth surface and finally exposing the sheet imagewise to give a relief image.

(iii) The method which comprises filling a clearance between an outer tube and an inner tube member of a double tube with a liquid photosensitive resin composition, and after curing of the resin, exposing the cured resin layer imagewise to give a relief image.

The method (i) has the following disadvantages. When a cured photosensitive resin sheet is bonded to the cylinder, there is formed a seam so that when a curable photosensitive resin composition is coated on top of the cured resin sheet, a variation takes place in coating thickness or coverage. In order to build up a sufficiently thick layer of such curable photosensitive resin, coating and drying must be repeated in multiple cycles but the formation of the above joint complicates the procedure and it is not easy to achieve a uniform coating thickness.

The method (ii) has the following disadvantages. It is difficult, even for a skilled worker, to wrap an unexposed photosensitive resin sheet around the supporting cylinder with perfect end alignment. Moreover, heating is required for evening the seam, which may cause degradation of the unexposed photosensitive sheet. Furthermore, as the seam cannot be evened in the strict sense of the term, the problem remains when it is desired to obtain a circumferentially seamless delicate image.

The method (iii) has the disadvantage that close dimensional tolerances must be respected in the fabrication of a double tube in order to assure a uniform layer thickness. Another serious drawback of this method is that air cells may enter the product cylindrical photosensitive resin sheet.

Furthermore, since the above-mentioned methods (i), (ii) and (iii) invariably involve the two steps of operation/i.e. formation of a photosensitive layer and subsequent exposure, the whole manufacturing process for printing plates is complicated.

Under the circumstances, the present inventor endeavored to find a commercially advantageous method for manufacturing a uniform-thickness, seamless cylindrical photosensitive resin structure and a commercially advantageous method for manufacturing a seamless cylindrical printing plate in one operation. The endeavor has resulted in the present invention.

DISCLOSURE OF THE INVENTION

The method of manufacturing a cylindrical photosensitive resin structure according to the present invention is characterized in that a liquid photosensitive resin composition is fed into a hollow cylindrical element while the cylindrical element is caused to spin at a high speed so as to centrifugally deposit the photosensitive resin composition uniformly on the inner surface of the cylindrical element and allow it to cure in situ.

In order to reinforce the product cylindrical photosensitive resin structure from its inside, the following alternative measures ($a_1$) and ($b_1$) may be optionally employed.

($a_1$) As the hollow cylindrical element is spun at a high speed so as to deposit the photosensitive resin composition uniformly on the inner surface of the cylindrical element and cause it to cure in situ, a cylindrical support element having an outer circumference complementary to the photosensitive resin layer is inserted prior to or after completion of the curing reaction.

($b_1$) After the hollow cylindrical element is spun at a high speed to centrifugally cause the photosensitive resin composition to be deposited uniformly on the inner surface of the cylindrical element and cure in situ, a support-forming liquid resin composition is further introduced into the hollow cylindrical element and the cylindrical element is further spun at a high speed to centrifugally cause the support-forming resin composition to be deposited uniformly on the cured photosensitive resin layer and cure in situ.

The method of manufacturing a cylindrical printing plate according to the present invention is characterized in that a liquid photosensitive resin composition is fed into a hollow actinic radiation-transparent cylindrical element while said cylindrical element is spun at a high speed to centrifugally cause said photosensitive resin composition to be deposited uniformly on the inner surface of said hollow cylindrical element while actinic radiation is projected from within the hollow cylindrical element for back-exposure of the photosensitive resin layer and actinic radiation is also projected from outside of the cylindrical element for an imagewise exposure of the photosensitive resin layer.

In this operation, for the purpose of reinforcing the product cylindrical photosensitive resin structure from its inside, the following alternative measures ($a_2$) and ($b_2$) may be optionally employed.

($a_2$) After the back exposure of the photosensitive resin layer by actinic light irradiation from inside of the cylindrical element, a cylindrical support element having a circumference complementary to the back-exposed layer is inserted.

(b₂) After the back exposure of the photosensitive resin layer by actinic light irradiation from within the hollow cylindrical element, a support-forming resin composition is introduced into the cylindrical element while said cylindrical element is spun at a high speed to centrifugally cause said support-forming resin composition to be deposited uniformly on the back-exposed layer and the resulting support-forming resin composition is caused to cure.

The manufacturing methods according to the present invention are described in detail hereinafter.

Photosensitive resin composition

As the photosensitive resin composition for use in accordance with the present invention, the following types of resin systems can be employed. (a) Photopolymerizable resin systems each consisting of a photopolymerizable monomer and a high polymer This category includes, among others, the system in which a monofunctional monomer is photo-polymerized in a high polymer matrix, the system in which a polyfunctional monomer is photo-polymerized in a high polymer matrix in the presence or absence of a monofunctional monomer, the system in which a monofunctional monomer is photo-polymerized in a prepolymer, the system in which a polyfunctional monomer and a monofunctional monomer are photo-polymerized in a prepolymer, and the system which consists of a prepolymer and a polymer.

Examples of said photo-polymerizable monomer include acrylic esters of polyhydric alcohols, urethane-type acrylic esters, unsaturated esters of polycarboxylic acids, unsaturated acid amides, acetylenically unsaturated monomers, glycidyl group-containing monomers and so on. As examples of said high polymer, there may be mentioned various polymers or prepolymers such as epoxy resins, polyesters, polyurethanes, polyethers, polyamides, polyacrylic acid or maleic acid copolymers, silicone resins, cellulosic resins, synthetic rubber type polymers and so on. (b) The systems each consisting of a light-sensitive compound and a high polymer This category includes the system in which a dichromate salt is used as said light-sensitive compound, the system in which an aromatic diazo compound is used, the system in which an aromatic azide compound is used, the system in which an organic halogen compound is used, and the system in which unsaturated high polymer molecules are crosslinked by means of a photopolymerization initiator. (c) The systems each comprising a high polymer having light-sensitive groups This category includes cinnamoyl group-containing high polymers, diazo group-containing high polymers, azide group-containing high polymers and so on.

(A) Manufacture of a cylindrical photosensitive resin structure

In accordance with the present invention, a cylindrical photosensitive resin structure is manufactured using a photosensitive resin system such as those mentioned above in the following manner.

A hollow cylindrical element of metal or other appropriate material is disposed with its centerline lying in a substantially horizontal plane and while the cylindrical element is spun at a low speed, a photosensitive resin system composition is introduced into the hollow cylindrical element using a suitable feeding means. Then, the cylindrical element is caused to spin at a high speed. As the cylindrical element is driven at the high speed, the photosensitive resin composition adherent to the inner wall of the cylindrical element is centrifugally diffused over the inner wall surface to give a layer of uniform thickness and free of air bubbles or cells. While this high-speed rotation is continued, the resin layer is cured and hardened by a suitable means such as evaporation of the solvent, heating, cooling or the like. If necessary, a coating layer for assisting in subsequent separation may be provided on the inner surface of the cylindrical element.

When the resin is to be cured by heating, such heating means as an infrared heater, an thermoelectric heater, a device for supplying a heated gas, etc. may be employed. The heat may be applied from whichever direction, i.e. from inside or outside of the hollow cylindrical element, or from both sides.

In connection with this thermal curing, if the system is placed under reduced pressure during rotation of the cylindrical element, the incidence of entry of air cells into the product cylindrical photosensitive resin structure is further reduced. Similarly, when curing of the resin is effected by evaporation of the solvent, this evaporation is facilitated if the system is brought under reduced pressure during rotation of the cylindrical element.

When the photosensitive resin composition is of the solvent dilution type, it can be hardened by evaporation of the solvent by heating or decompression. When the photosensitive resin composition is a heat-curable resin composition, the resin is hardened as it is cured by heat. When the photosensitive resin composition is a molten thermoplastic photosensitive resin, it is hardened by cooling.

After completion of curing or hardening, the hardened product is taken out from the inner surface of the cylindrical element to give the desired seamless cylindrical photosensitive resin structure.

When the cylindrical element is somewhat tapered, a tapered cylindrical photosensitive resin structure or a cylindrical photosensitive resin structure whose thickness increases gradually from one end to the other, instead of a truely cylindrical structure, can be manufactured by controlling the viscosity of the photosensitive resin composition and the rotational speed of the cylindrical element By so doing, mounting of the product structure on and dismounting thereof from a machine cylinder or the like are facilitated in the field use of the product cylindrical photosensitive resin structure.

Further, in accordance with the present invention, it can be so arranged that the cylindrical element is spun at a high speed to centrifugally cause the photosensitive resin composition to be uniformly deposited on the inner surface of the cylindrical element and, before completion of hardening of the resin, a cylindrical support element having a circumference complementary to the resin layer is inserted and the rotation is continued for further curing and hardening. In this manner, a cylindrical photosensitive resin structure integral with the cylindrical support element can be manufactured. The cylindrical support element may also be inserted after completion of resin hardening. It is also possible to feed a resin composition into the cylindrical support element after its insertion and continue the rotation to centrifugally disperse the resin composition evenly for reinforcing the cylindrical support element.

As examples of said cylindrical support element, there may be mentioned a cylindrical seamless fabric element prepared by cylindrical weaving, a cylindrical metal wire-mesh element, a cylindrical metal-plated mesh element, a cylindrical plastic network element, a cylindrical knitted fabric element and so on.

In accordance with the present invention, it may be so arranged that the hollow cylindrical element is spun at a high speed to centrifugally cause the photosensitive resin composition t be uniformly deposited and solidified on the inner surface of the cylindrical element and after a support-forming resin composition is fed into the cylindrical element, the cylindrical element is further spun at a high speed to cause the support-forming resin composition to be uniformly deposited and solidified on top of the solidified resin layer.

Using a printing plate manufactured from the seamless cylindrical photosensitive resin structure obtained in the routine manner, a seamless pattern image can be reproduced.

(B) Manufacture of a cylindrical printing plate

In accordance with the present invention, as described in detail hereinafter, a printing plate can be manufactured immediately following the formation of a cylindrical photosensitive resin layer on the inner surface of a hollow cylindrical element.

With an actinic radiation-transparent cylindrical element disposed with its centerline lying in a substantially horizontal plane and while it is spun at a low speed, a photosensitive resin composition is introduced into the revolving cylinder by means of a suitable feeding means and, then, the cylindrical element is caused to spin at a high speed. By this high-speed revolution of the cylindrical element, the photosensitive resin composition deposited on the inner surface of the cylindrical element is centrifugally diffused over the whole inner wall of the cylindrical element to form an air cell-free resin layer of uniform thickness on said surface. It is also possible to place the system under reduced pressure during rotation of the cylindrical element.

When a uniform layer of said photosensitive resin composition has been formed on the inner surface of the cylindrical element, the photosensitive resin layer is back-exposed with actinic light irradiation from the inside of the cylindrical element. Prior to this back exposure, masking exposure may be performed by actinic light irradiation through a masking film so as to form a relief supporting base. And either simultaneously with or before or after said back exposure, relief exposure of the photosensitive resin layer is performed by actinic light irradiation from outside of the cylindrical element through an image carrier (a negative or positive film).

The image carrier is preferably disposed in contact with the inner surface of the hollow cylindrical element but, if desired, may be provided on the outer surface of the cylindrical element. When the former arrangement is used, it is necessary to attach the image carrier to the inner surface of the hollow cylindrical element prior to feeding of the photosensitive resin composition into the cylindrical element. In the case of the latter arrangement, a uniform photosensitive resin layer is first formed and, after back exposure, irradiation with actinic light is performed through an image carrier affixed to the outer surface of the cylindrical element or an image carrier travelling outside of the cylindrical element.

The term "actinic radiation or light" as used herein means any and all of such radiations as ultraviolet light, x-rays, electron beams and so on. As materials for the actinic radiation-transparent cylinder, there may be mentioned various inorganic glasses and organic glasses comprising polymethyl methacrylate, polystyrene, polycarbonate, polyolefin, polyvinyl chloride and other resins.

When ultraviolet light is used as said actinic radiation, a high-pressure mercury-vapor lamp, a super-high-pressure mercury vapor lamp, a carbon arc lamp, xenon lamp, a metal halide lamp, a chemical lamp, a black light and so on may be employed.

After completion of the above-mentioned back exposure and relief exposure, the exposed photosensitive resin layer is taken out from the inside of the cylindrical element and the unexposed area is washed out, for example by spraying with a washout solution and, if necessary, is dried and post-exposed to give the desired seamless cylindrical printing plate.

In the above process, after back exposure of the photosensitive resin layer with actinic light irradiation from inside of the cylindrical element (whether before or after completion of relief exposure), a cylindrical support element having an outer circumference complementary to the back-exposed layer can be inserted.

It may also be so arranged that, after said back exposure of the photosensitive resin layer with actinic light from inside of the hollow cylindrical element, a support-forming resin composition is introduced into the cylindrical element and the cylindrical element is caused to spin at a high speed to thereby centrifugally deposit the support-forming resin composition uniformly on top of the back-exposed resin layer, followed by solidification of the support-forming resin.

As the cylindrical support element, one similar to the element described under the heading (A) can be utilized.

Effects of the Invention

Since the manufacturing method according to the present invention comprises feeding a photosensitive resin composition into a hollow cylindrical element and causing the cylindrical element to spin at a high speed to centrifugally cause the resin composition to be uniformly deposited and cured on the inner surface of said hollow cylindrical element, a circumferentially completely homogeneous seamless cylindrical structure having a true-round cross-section can be easily manufactured. Therefore, by processing this structure into a printing plate and performs printing with the resulting plate, a seamless image can be successfully obtained.

Furthermore, by driving the cylindrical element at a high speed to centrifugally deposit the photosensitive resin composition uniformly on the inner surface of the cylindrical element and performing the back exposure and relief exposure during the revolution of the cylindrical element, a circumferentially completely homogeneous seamless cylindrical printing plate can be obtained in one operation.

Moreover, since a cylindrical photosensitive resin structure or cylindrical printing plate having any desired thickness can be manufactured in one operation, the manufacturing process is considerably simplified as compared with the conventional methods such as the method wherein a plurality of photosensitive resin composition layers are provided, the method which comprises wrapping and end-welding stages, and the method in which a liquid photosensitive resin composition is introduced into the clearance between the outer and inner elements of a double tube. Accordingly, the method according to the present invention makes for an increase in productivity and a remarkable increase in the uniformity of product thickness.

Furthermore, because the solidification of the deposited photosensitive resin takes place during high-speed rotation of the cylindrical element, there is an additional advantage that the product cylindrical structure is free of air cells.

Therefore, the present invention contributes a great deal to the fields of industry where cylindrical photosensitive resin structures and cylindrical printing plates are used and particularly in the field where flexographic printing plates are employed.

BRIEF DESCRIPTION OF THE DRAWINGS

FIG. 3 is a cross-section view in the transverse direction and FIG. 4 is a partial cross-section view in the longitudinal direction;

FIGS. 7 and 8 show the feeding means for introducing a liquid photosensitive resin composition into the hollow cylinder (1) illustrated in FIGS. 5 and 6. FIG. 7 is a cross-section view in the transverse direction and FIG. 8 is a partial cross-section view in the longitudinal direction;

FIG. 9 is a cross-section view showing the cylindrical structure obtained in Example 2;

FIG. 10 is a partially exploded front view showing still another embodiment of the apparatus used in practicing the method of the present invention;

Figure 2:
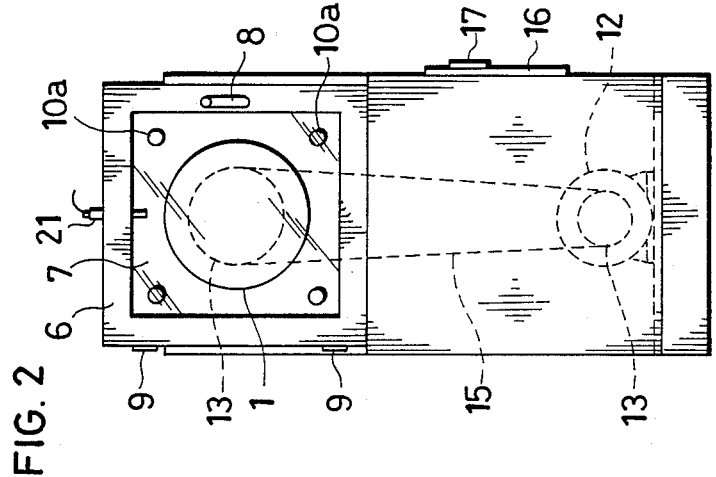
FIG. 2 is a left-side elevation view of the same apparatus.

The reference numerals and symbols used in the drawings have the following meanings.
(1) a hollow cylindrical element,
(2) a side plate,
(3) a rotary shaft,
(4) a dam,
(5) a housing,
(6) a door,
(7) a window,
(8) a handle,
(9) a hinge,
(10a) a heat source,
(10b) an actinic light source,
(10c) an actinic light source,
(11) a base,
(12) a motor,
(13),(14) pulleys,
(15) a belt,
(16) an operation panel,
(17) a switch,
(18) a vacuum gage,
(19) a tachometer,
(20) a temperature control,
(21) a temperature sensor,
(22) feeding means,
(23) a support roll
(24) a driven gear,
(25) a drive gear,
(26) a drive shaft,
(27) a cylindrical support element,
(A) a photosensitive resin composition,
(B) a solidified photosensitive resin layer,
(F) an image carrier.

Best Mode for Carrying Out the Invention

The following examples are intended to illustrate the present invention in further detail. In the examples, all "parts" and "%" are by weight.

EXAMPLE 1

Figure 1:
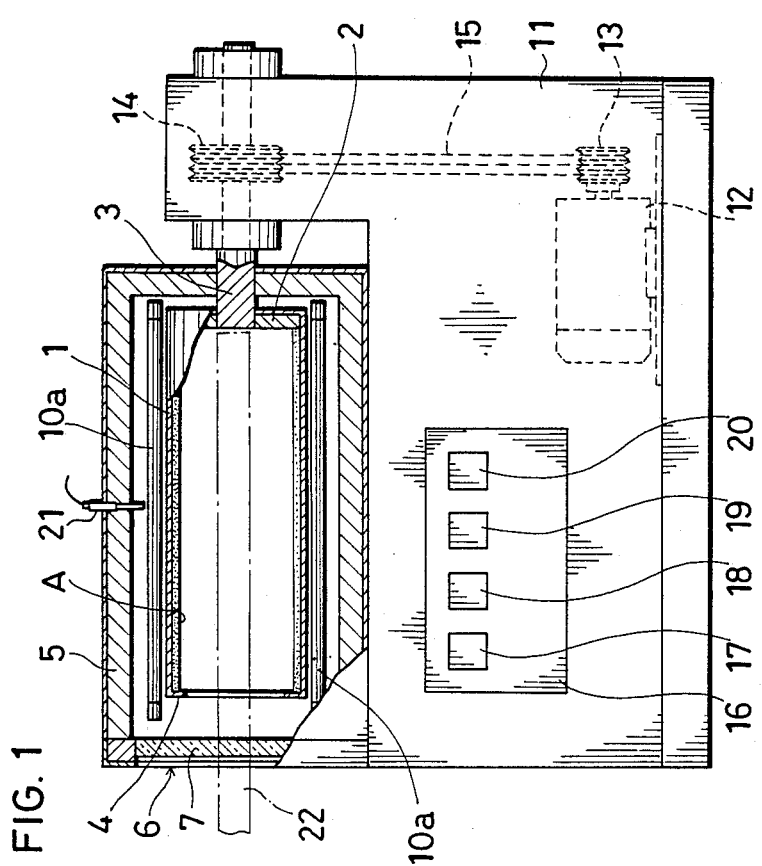
FIG. 1 is a partially exploded front view showing an embodiment of the apparatus which is used in practicing the method of the present invention.

FIG. 1 is a partially exploded front view showing an embodiment of the apparatus used in practicing the method of the present invention, and FIG. 2 is a left side-elevation view of the same.

Indicated at 1 is a hollow cylindrical element made of metal which is disposed with its centerline lying in a substantially horizontal plane and, with one of its end openings is closed by a side plate 2. The hollow cylindrical element 1 is rotatable at a variable speed about a rotary shaft 3 mounted on the side plate 2.

The reference numeral 4 represents a dam disposed inwardly at the free end of the hollow cylindrical element 1. Though not shown in the drawings, a cover having a central opening may be removably affixed in lieu of, or in addition to, said dam 4.

Indicated at 5 is a housing which covers the whole cylindrical element 1. The housing 5 is provided with a door 6 on the free end side of the hollow cylindrical element 1 and a window 7 comprising a glass pane is fitted in the door 6. A handle used for opening and closing the door 6 is indicated at 8 and a hinge associated therewith is shown at 9.

The reference symbol 10a represents an infrared heater which is an example of the heat source, with 4 units of such infrared heater being disposed at 4 corners within the housing 5.

Referring, further, to FIGS. 1 and 2, the reference numeral 11 represents a base, 12 a motor for driving the drive shaft 3, 13 a pulley mounted on the drive shaft of the motor 12, 14 a pulley mounted on the rotary shaft 3, 15 a belt thrown over and traversing between said two pulleys 13, 14, 16 an operation panel, 17 a switch, 18 a vacuum gage, 19 a tachometer, 20 a temperature control, and 21 a temperature sensor attached to the housing 3.

Figure 3:
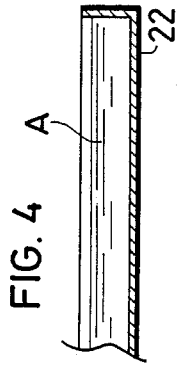
FIGS. 3 and 4 illustrate the feeding means for introducing a liquid photosensitive resin composition into the hollow cylinder (1) of the apparatus illustrated in FIGS. 1 and 2.
Figure 4:
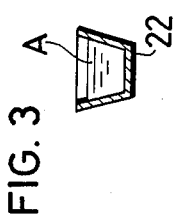

Referring to FIGS. 3 and 4 which illustrate an example of feeding means for introducing a liquid photosensitive resin composition into the hollow cylindrical element 1 of the apparatus shown in FIGS. 1 and 2, FIG. 3 is a sectional view taken in the transverse direction and FIG. 4 is a sectional view in the longitudinal direction. The reference numeral 22 indicates an elongated trough-shaped feeding means, while the photosensitive resin composition is indicated by the symbol A.

Using the above apparatus, a cylindrical photosensitive resin structure was manufactured in the following manner.

The photosensitive resin composition A used was a composition of 100 parts of a styrene-butadiene block copolymer with a styrene content of 42%, 25 parts of a polybutadiene with a molecular weight of 1,000, 4 parts of tetraethylene glycol diacrylate, 14 parts of trimethylolpropane triacrylate, 0.8 part of benzoyl isopropyl ether, 0.01 part of methylhydroquinone, and 120 parts of methyl ethyl ketone.

The door 6 of the housing 5 was opened and the feeding means 22 filled with the above photosensitive resin composition A was inserted as far as it went into the hollow cylindrical element 1 as shown by dot-chain lines in FIG. 1. The motor 12 was then started to cause the hollow cylindrical element 1 to spin at a low speed of 100 rpm and the feeding means 22 was gently turned to pour the photosensitive resin composition A. The feeding means 22 was withdrawn and the door 6 of the housing 5 was closed. Then, the hollow cylindrical element 1 was caused to spin at a high speed of 1,000 rpm to thereby deposit the photoconductive resin composition A uniformly on the inner surface of the hollow cylindrical element 1 under the centrifugal force. While this high-speed revolution of the hollow cylindrical element 1 was continued, the resin composition was heated and dried by the infrared heaters as the heat source 10a and, as required, the vacuum means 17 was actuated to decompress the atmosphere within the housing 5 and cylindrical element 1, whereby the photosensitive resin composition A was gradually solidified.

After completion of solidification, the door 6 of the housing 5 was opened and the solidified cylindrical structure was pulled off from the hollow cylindrical element 1 to give a cylindrical photosensitive resin structure having a wall thickness of 7.0 mm. The accuracy of thickness was not larger than ±0.1 mm.

EXAMPLE 2

Figure 6:
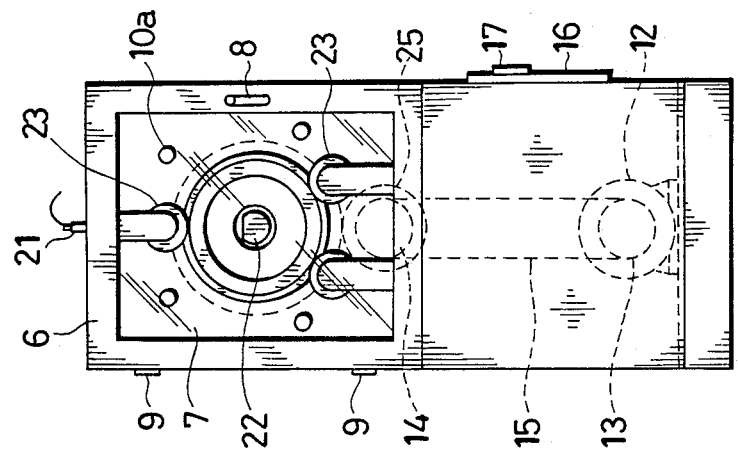
FIG. 6 is a left-side elevation view.
Figure 5:
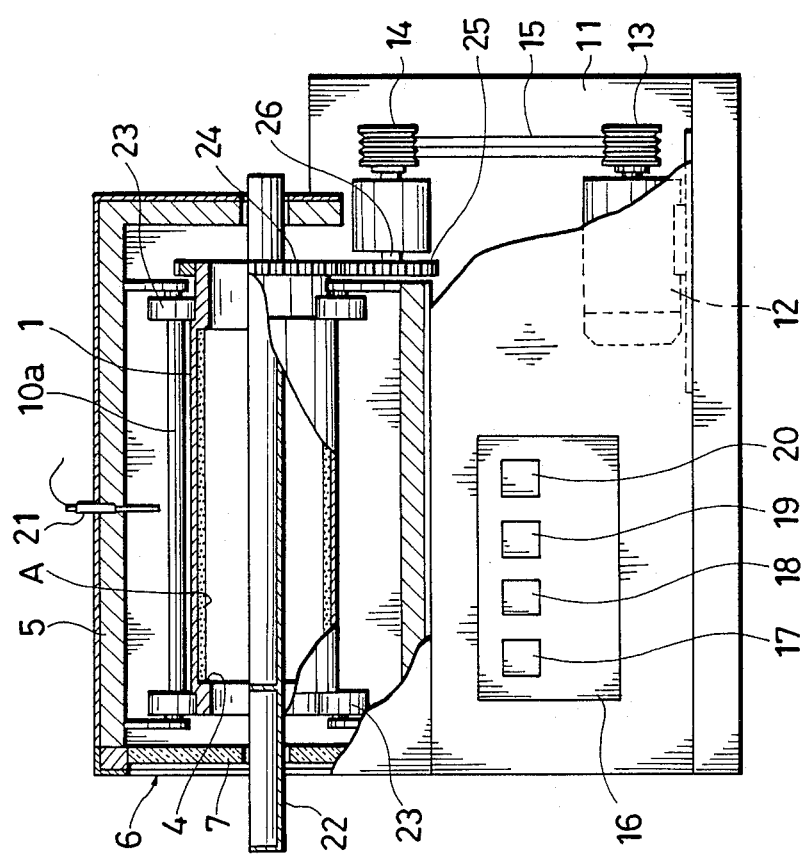
FIG. 5 is a partially exploded front view showing another embodiment of the apparatus used in practicing the method of the present invention.

FIG. 5 is a partially exploded front view showing another embodiment of the apparatus used in practicing the method of the present invention. FIG. 6 is a left side-elevation view of the same.

The reference numeral 1 indicates a hollow cylindrical element made of metal which is disposed with its centerline lying in a horizontal plane. The cylindrical element 1 is supported by one support roll 23 in the upper position and two support rolls 23 in the lower position at either end as shown. A driven gear 24 is mounted externally on an extension of the peripheral wall of the hollow cylindrical element 1 on the fixed side thereof. The ends of the inner peripheral wall of the hollow cylindrical element 1 are each stepped or landed to form a dam 4.

Below said extension of the cylindrical element 1 on its fixed side, a drive gear 25 is mounted on a housing 5 in such a manner that it is driven together with a drive shaft 26. The driven gear 24 is in mesh with said drive gear 25.

In these views, all other reference numerals and symbols represent parts corresponding to the parts shown in FIGS. 1 and 2.

FIGS. 7 and 8 show an example of the feeding means for introducing a photosensitive resin composition into the hollow cylindrical element 1 of the apparatus illustrated in FIGS. 5 and 6. This feeding means has a sectional configuration of the letter C. FIG. 7 is a sectional view in the transverse direction and FIG. 8 is a partial cross-section view in the longitudinal direction. The reference numeral 22 indicates an elongated trough-shaped feeding means, while said photosensitive resin composition is indicated at (A).

Using the above apparatus, a cylindrical photosensitive resin structure was manufactured in the following manner.

As the photosensitive resin composition A, the same composition as that described in Example 1 was employed.

The feeding means 22 filled with the photosensitive resin composition A was inserted into the hollow cylindrical element 1 and the motor 12 was started to drive the hollow cylindrical element 1 at a low speed of 60 rpm. The feeding means 22 holding the photosensitive resin composition A was gently turned to pour the photosensitive resin composition A into the hollow cylindrical element, after which the feeder means 22 was pulled out.

Then, the hollow cylindrical element 1 was caused to spin at a high speed of 600 rpm, whereby the photosensitive resin composition A was uniformly deposited on the inner surface of the hollow cylindrical element 1 under the centrifugal force. While the high-speed rotation of the cylindrical element 1 was continued, heated air was introduced from a gas inlet not shown and, at the same time, the atmosphere within the housing 5 was withdrawn through a gas outlet, whereby the photosensitive resin composition A deposited on the inner surface of the hollow cylindrical element 1 was caused to solidify by degrees. The heat source 10a, although provided, was not used in the above operation.

When the resin composition had become semi-solid, the revolution of the hollow cylindrical element 1 was stopped, the door 6 of the housing 5 was opened, and a seamless fabric cylinder (a cylinder-woven fabric element having a circumference complementary to the photosensitive resin layer, as an example of said cylindrical support element 27 was fitted in intimate contact with the semi-solid photosensitive resin layer on the inner surface of the hollow cylindrical element 1. Then, the hollow cylindrical element 1 was driven again at said high speed for complete solidification of the photosensitive resin layer.

After completion of solidification, the revolution of the hollow cylindrical element was stopped and the cylindrical structure was exfoliated from the hollow cylindrical element 1. The above procedure gave a cylindrical structure consisting of the cylindrical support element 27 and, as deposited thereon, a 4.0 mm thick solidified photosensitive resin layer. The sectional view of this product structure is shown in FIG. 9.

EXAMPLE 3

FIG. 10 is a partially exploded front view showing a still another embodiment of the apparatus used in practicing the method of the present invention. The left side-elevation view of this apparatus is identical with the view shown in FIG. 2.

Figure 11:
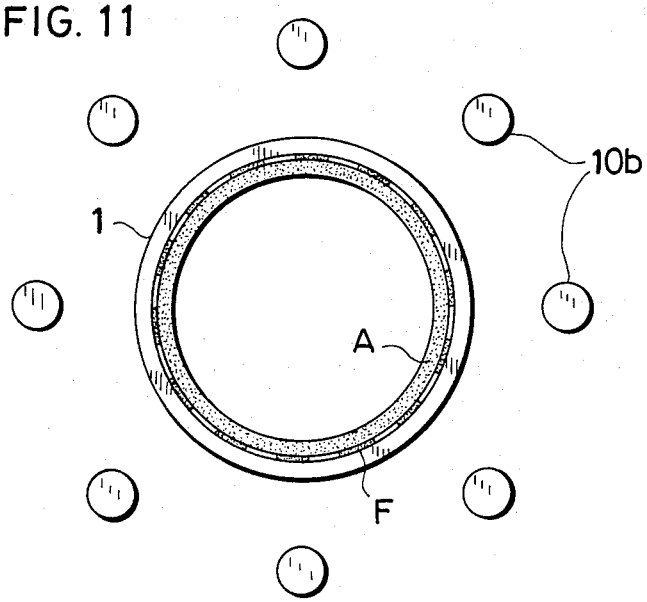
FIG. 11 is a schematic side elevation view showing the cardinal part.

FIG. 11 is a schematic side elevation view showing the cardinal part.

As the hollow cylindrical element 1, a glass element was employed.

The reference symbol F is a negative or positive film used as said image carrier, which is mounted in intimate contact with the inner circumferential wall of the hollow cylindrical element 1.

The reference symbol 10b represents a plurality of chemical lamps, as an example of said actinic light source, as installed within the housing 5.

Indicated by dot-chain lines at 22 is a feeding means for introducing a liquid photosensitive resin composition into the hollow cylindrical element. After removal of this feeding means 22, a high-pressure mercury-vapor lamp 10c as an example of said actinic light source is inserted into the same position.

Other parts are similar to the corresponding parts shown in FIGS. 1 and 2.

Using the above apparatus, a cylindrical photosensitive resin structure was manufactured in the following manner.

First, a negative or positive film F as an example of said image carrier was affixed to the inner circumferential surface of the hollow cylindrical element 1.

The door 6 of the housing 5 was opened and the feeding means 22 carrying the photosensitive resin composition A was inserted as far as it went into the hollow cylindrical element 1 as shown by broken lines in FIG. 10. Then, the motor 12 was started to drive the hollow cylindrical element 1 at a low speed of 100 rpm. In this condition, the feeding means 22 is gently turned to pour the photosensitive resin composition A. Thereafter, the feeding means 22 was pulled out and a high-pressure mercury-vapor lamp 10c was installed in its stead. The hollow cylindrical element 1 was then caused to spin at a high speed of 1,000 rpm to thereby deposit the resin composition uniformly on the inner surface of the hollow cylindrical element 1 under the centrifugal force. While this high-speed revolution of the hollow cylindrical element was continued, the vacuum means 17 was actuated as necessary to reduce the pressure in the housing 5 and hollow cylindrical element 1 and the relief exposure with chemical lamps 10b and the back exposure with the high-tension mercury-vapor lamp 10c were performed. The exposure time for back exposure was set longer than that for relief exposure.

After completion of the exposure process, the cured cylindrical structure was exfoliated and pulled out from the hollow cylindrical element 1. The outer circumferential surface of the cylindrical structure was sprayed with a washout solution to wash off the uncured resin and, then, rinsed with a spray of water. After drying, the cylindrical structure was set on a revolving element and its circumferential surface was exposed with ultraviolet light for post exposure to give a cylindrical printing plate having a thickness of 7.0 mm.

EXAMPLE 4

Figure 12:
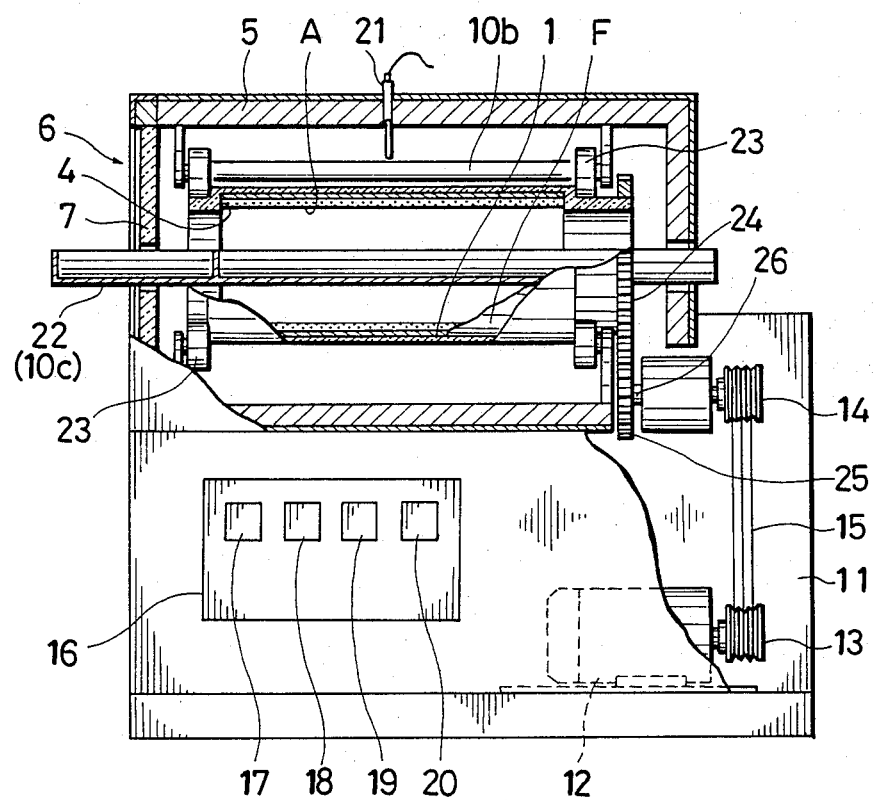
FIG. 12 is a partially exploded front view showing a further embodiment of the apparatus used in practicing the method of the present invention.

FIG. 12 is a partially exploded front view showing a still another embodiment of the apparatus used in practicing the method of the present invention. The left side-elevation view is identical with the corresponding view in FIG. 6.

As the hollow cylindrical element 1, a glass cylinder was used.

The reference symbol F represents a negative or positive film, as said image carrier, which is disposed in intimate contact with the inner circumferential surface of the hollow cylindrical element 1.

The reference symbol 10b represents a plurality of chemical lamps as an example of said actinic light source as disposed within the housing 5.

Indicated by dot-chain lines at 22 is a feeding means for introducing a photosensitive resin composition into the hollow cylindrical element 1 and after withdrawal of said feeding means 22, a high-pressure mercury-vapor lamp as an example of said actinic light source 10c is inserted in its stead.

All other parts are similar to the corresponding parts in FIGS. 5 and 6.

Using the above apparatus, a cylindrical photosensitive resin structure was manufactured in the following manner.

First, a negative or positive film F was affixed to the inner circumferential surface of the hollow cylindrical element 1.

Then, the feeding means 22 containing the photosensitive resin composition A was inserted into the hollow cylindrical element 1 and the motor 12 was started to drive the hollow cylindrical element 1 at a low speed of 60 rpm. In this condition, the feeding means 22 carrying the photosensitive resin composition A was gently turned to pour the resin composition A, after which the feeding means 22 was pulled out and a high-pressure mercury-vapor lamp 10c was positioned in its stead.

Thereafter, the hollow cylindrical element 1 was caused to spin at a high speed of 600 rpm, whereby the photosensitive resin composition A wa uniformly deposited on the inner surface of the hollow cylindrical element 1 under the centrifugal force. While the high-speed rotation of the hollow cylindrical element 1 was further continued, back exposure with said high-pressure mercury-vapor lamp 10c and relief exposure with said chemical lamps 10b were carried out in succession in the order mentioned.

After completion of the exposure process, the high-pressure mercury-vapor lamp 10c was withdrawn and the rotation of the hollow cylindrical element 1 was suspended. Then, a seamless fabric cylinder (a cylinder-woven fabric carrying an adhesive agent over its outer circumferential surface and having an outer circumference complementary to the resin layer, as an example of said cylindrical support element 27 was fitted into intimate contact with the resin layer formed on the inner surface of the hollow cylindrical element 1. At the same time, an infrared lamp was installed in the place of the high-pressure mercury-vapor lamp 10c. Then, the high-speed rotation of the hollow cylindrical element 1 was re-started and the infrared lamp was actuated to cause the adhesive agent to cure.

After completion of curing of the adhesive agent, the rotation of the hollow cylindrical element 1 was stopped and the cylindrical structure was exfoliated and taken out from the hollow cylindrical element 1 to give a cylindrical structure consisting of a cylindrical support element 27 and, as disposed thereon, a photosensitive resin layer B, which was similar to the structure shown in FIG. 9. The outer circumferential surface of this structure was sprayed with a washout solution to wash off the uncured resin and was then rinsed with a spray of water. After drying, the cylindrical structure was set on a revolving element and its outer circumferential surface was irradiated with ultraviolet light for post-exposure. The above procedure gave a 6.0 mm thick cylindrical printing plate.

EXAMPLE 5

After completion of the exposure process described in Example 4, the high-pressure mercury-vapor lamp 10c was withdrawn and the feeding means 22 filled with a polyurethane resin composition as an example of said support-forming resin composition was inserted and turned to supply the resin composition. Then, after the feeding means 22 was withdrawn, the hollow cylindrical element 1 was caused to spin at a high speed to thereby deposit the polyurethane resin uniformly on the inner surface of the hollow cylindrical element under the centrifugal force. Then, an infrared lamp was inserted and actuated for curing the resin layer.

After completion of the curing reaction, the rotation of the hollow cylindrical element 1 was stopped and the cylindrical structure was exfoliated and taken out from the cylindrical element 1. The resulting cylindrical structure consisted of the cylindrical support element 27 and, as disposed on its outer circumferential surface, a photosensitive resin layer B. This product was similar to the product shown in FIG. 9. The outer circumferential surface of this structure was sprayed with a washout solution to remove the uncured resin and was then rinsed with a spray of water. After drying, the cylindrical structure was set on a revolving element and its outer circumferential surface wa irradiated with ultraviolet light for post-exposure. The above procedure yielded a 5.0 mm thick printing plate.

Industrial Utility

The manufacturing method of the present invention is of value not only for the manufacture of relief printing resin plates, particularly resin plates for flexographic printing, but also for the manufacture of resin plates for rotary screen plating, intaglio printing, planographic printing, etc. and for other purposes.

What is claimed is:

1. In a method of manufacturing a seamless cylindrical photosensitive resin structure which comprises feeding a liquid photosensitive resin composition into a hollow cylindrical element and spinning the hollow cylindrical element at a high speed to centrifugally deposit the photosensitive resin composition uniformly on the inner surface of the hollow cylindrical element and cause the resin composition to cure in situ, the improvement comprising inserting a cylindrical seamless fabric support element, prepared by cylindrical weaving and with an outer circumferential surface complementary to the surface of the photosensitive resin composition deposited on the inner surface of the hollow cylindrical element, into the hollow cylindrical element before completion of curing of the photosensitive resin composition.

2. In a method of manufacturing a seamless cylindrical photosensitive resin structure which comprises feeding a liquid photosensitive resin composition into a hollow cylindrical element and spinning the hollow cylindrical element at a high speed to centrifugally deposit the photosensitive resin composition uniformly on the inner surface of the hollow cylindrical element and cause the resin composition to cure in situ, the improvement comprising inserting a cylindrical seamless fabric support element, prepared by cylindrical weaving and with an outer circumferential surface complementary to the surface of the photosensitive resin composition deposited on the inner surface of the hollow cylindrical element and having an adhesive coated thereon, into the hollow cylindrical element after completion of curing of the photosensitive resin composition.

3. A method of producing a seamless cylindrical printing plate which comprises feeding a photosensitive resin composition into a hollow actinic light-transparent cylindrical element, spinning the hollow actinic light-transparent cylindrical element at a high speed to centrifugally deposit the photosensitive resin composition uniformly on the inner surface of the cylindrical element, irradiating the photosensitive resin layer with actinic light from outside of the cylindrical element through an image carrier for relief exposure and irradiating the resulting photosensitive resin layer with actinic light from within the cylindrical element for back exposure, inserting a cylindrical seamless fabric support element, prepared by cylindrical weaving and with an outer circumferential surface complementary to the back-exposed photosensitive resin layer and having an adhesive coated thereon, into the photosensitive resin layer deposited on the inner surface of the hollow cylindrical element, removing the seamless fabric support element having the photosensitive resin layer adhered thereto, removing uncured photosensitive resin from the photosensitive resin layer, and exposing the outer surface of the photosensitive resin layer to actinic radiation.

* * * * *